United States Patent
Park et al.

(10) Patent No.: US 7,557,649 B2
(45) Date of Patent: Jul. 7, 2009

(54) DC OFFSET CANCELLATION CIRCUIT AND PROGRAMMABLE GAIN AMPLIFIER USING THE SAME

(75) Inventors: Sang Gyu Park, Gyunggi-Do (KR); Chang Soo Yang, Gyunggi-Do (KR); Kwang Du Lee, Jeonlanam-Do (KR)

(73) Assignee: Samsung Electro-Mechanics Co., Ltd., Suwon, Gyunggi-do (KR)

( * ) Notice: Subject to any disclaimer, the term of this patent is extended or adjusted under 35 U.S.C. 154(b) by 72 days.

(21) Appl. No.: 11/684,783

(22) Filed: Mar. 12, 2007

(65) Prior Publication Data
US 2007/0216476 A1    Sep. 20, 2007

(30) Foreign Application Priority Data
Mar. 14, 2006 (KR) .............. 10-2006-0023314

(51) Int. Cl.
  *H03F 1/02* (2006.01)
(52) U.S. Cl. ............................ 330/9; 330/69
(58) Field of Classification Search .............. 330/9, 330/69, 252, 260
  See application file for complete search history.

(56) References Cited

U.S. PATENT DOCUMENTS 3,509,369 A * 4/1970 Crouse et al. ............... 327/363
3,868,596 A * 2/1975 Williford ................. 331/108 R
4,356,451 A * 10/1982 Wilson ..................... 330/107
4,455,534 A * 6/1984 Gillig ....................... 330/51
4,857,860 A   8/1989 Sevastopoulos
4,928,059 A * 5/1990 Franklin et al. ......... 324/123 R

FOREIGN PATENT DOCUMENTS

JP    2001-111358 A    4/2001

* cited by examiner

*Primary Examiner*—Henry K Choe
(74) *Attorney, Agent, or Firm*—Lowe Hauptman Ham & Berner

(57) ABSTRACT

In a DC offset cancellation circuit, an operational amplifier is provided with an inverse terminal, a non-inverse terminal and an output terminal. A first resistor is connected to the non-inverse terminal. A second resistor connected between the inverse terminal and the output terminal. A DC offset cancellation resistor is connected between the inverse terminal and the non-inverse terminal. Also, in each of first and second DC offset cancellation circuits of the programmable gain amplifier, an operational amplifier is provided with an inverse terminal, a non-inverse terminal and an output terminal. A first resistor is connected to the non-inverse terminal. A second resistor is connected between the inverse terminal and the output terminal. A DC offset cancellation circuit is connected between the inverse terminal and the non-inverse terminal. Here, the first and second DC offset cancellation circuits are connected with each other in series.

4 Claims, 5 Drawing Sheets

DC OFFSET CANCELLATION CIRCUIT AND PROGRAMMABLE GAIN AMPLIFIER USING THE SAME

CLAIM OF PRIORITY

This application claims the benefit of Korean Patent Application No. 2006-23314 filed on Mar. 14, 2006 in the Korean Intellectual Property Office, the disclosure of which is incorporated herein by reference.

BACKGROUND OF THE INVENTION

1. Field of the Invention

The present invention relates to a DC offset cancellation circuit and a programmable gain amplifier using the same. More particularly, the present invention relates to a DC offset cancellation circuit having a DC offset cancellation resistor connected between an inverse terminal and a non-inverse terminal of an operational amplifier, and a programmable gain amplifier (PGA) using the same.

2. Description of the Related Art

In general, an operational amplifier is considered ideal when it has an input voltage of "0" and an output voltage of "0." However, actually, the operational amplifier (OP-Amp) has a moderate output voltage, i.e., an offset voltage even at an input voltage of "0." This direct current (DC) offset occurs due to an internal structure of the operational amplifier. Accordingly, the operational amplifier may be equipped with an offset adjuster for adjusting the DC offset so that the output voltage is "0" at the input voltage of "0." The direct current (DC) offset, if present, may adversely affect processing of a normal signal source. Thus, existence of the DC offset is most decisive factor of performance in wireless telecommunication devices.

Especially, an analogue signal inputted to an alternating current (A/D) converter of a chaotic RF transceiver is highly susceptible to the DC offset, which thus should be necessarily eliminated.

FIG. 1 is a block diagram partially illustrating a receiver of a chaotic RF transceiver.

As shown in FIG. 1, a signal inputted to an A/D converter 104 is fed from an antenna through a detector 101 and a low pass filter (LPF) 102. The signal fed from the antenna and detected by the detector 101 is affected by multi-path fading or surrounding interference signals. This accordingly causes the detected signal to be non-uniform in its size and to fluctuate unstably. This influences the A/D converter 104 for converting the analogue signal into a digital pulse, rendering the signal hardly discernable. Therefore, the detected signal, before being inputted to the A/D converter, should be processed to have a constant size. This function is executed by a programmable gain amplifier 103.

FIG. 2 is a block diagram illustrating a conventional programmable gain amplifier (PGA).

The PGA shown in FIG. 2 includes three operational amplifiers 201, 202 and 203. The first operational amplifier 201 has an inverse terminal to which a detected signal is inputted through resistors 221 and 222. An output from the operational amplifier 201 is fed back to the inverse terminal of the first operational amplifier 201 through the resistor 223 and the capacitor 231. The inverse terminal of the first operational amplifier 201 has an input resistance varied by a switch 211 which switches on/off in response to a digital control signal, thereby controlling gain of the first operational amplifier 201.

The second operational amplifier 202 has an inverse terminal to which the output of the first operational amplifier 201 is inputted through resistors 224, 225, and 226. An output from the second operational amplifier 202 is fed back to the inverse terminal of the second operational amplifier 202 through a resistor 227 and a capacitor 232. The inverse terminal of the second operational amplifier 202 has an input resistance varied by switches 212 and 213 which switch on/off in response to a digital control signal, thereby controlling gain of the second operational amplifier 202.

The switch is operated in response to a 3-bit digital control signal to control gain of the first and second operational amplifiers 201 and 202. This keeps total gain of the PGA constant. The capacitors 231 and 232 may be optionally adopted to serve as a low pass filter (LPF) that feeds back only a signal of a low frequency bandwidth.

The third operational amplifier 203 has an inverse terminal to which the output of the second operational amplifier 202 is inputted through a resistor 228. An output of the third operational amplifier 203 is filtered by the LPF including the resistor 229 and the capacitor 233, and then fed back to the non-inverse terminal. The output of the third operational amplifier 202 is inputted to the inverse terminal of the first operational amplifier 201 through a resistor 230.

In the conventional PGA, DC offset is cancelled as follows.

Out of PGA outputs from the second operational amplifier 203, a low frequency component is fed back to an input of the PGA. In this process, the PGA output of the low frequency component is filtered by the low pass filter including the resistor 229 and the capacitor 233, i.e., a feedback circuit of the third operational amplifier 203, and then inputted to the first operational amplifier 201, thereby preventing a DC component from being output.

In the conventional PGA, a feedback process is compulsory for DC cancellation, thus necessitating an additional operational amplifier and accessory devices. This consumes considerable power, accordingly not suitable for use in mobile telecommunication devices running on battery power. Also, the third operational amplifier 203 used in the feedback is a non-ideal operational amplifier which requires DC offset cancellation. Thus, the third operational amplifier 203 normally acts as the LPF only when a separate DC voltage corresponding to the DC offset is applied. Moreover, the conventional PGA, when configured in an integrated circuit, requires a pad that occupies a relatively large space. Besides, the conventional operational amplifier should be optimized to match a circuit for varying a voltage outside the integrated circuit.

SUMMARY OF THE INVENTION

The present invention has been made to solve the foregoing problems of the prior art and therefore an aspect of the present invention is to provide a DC offset circuit using a DC offset resistance, and a programmable gain amplifier (PGA) circuit using the same, thereby enabling a wireless telecommunication device consuming low power.

According to an aspect of the invention, the DC offset cancellation circuit includes an operational amplifier provided with an inverse terminal, a non-inverse terminal and an output terminal; a first resistor connected to the non-inverse terminal; a second resistor connected between the inverse terminal and the output terminal; and a DC offset cancellation resistor connected between the inverse terminal and the non-inverse terminal.

According to an embodiment of the invention, the DC offset cancellation circuit further comprises a capacitor connected in parallel to the second resistor between the inverse terminal and the output terminal.

According to another aspect of the invention, the programmable gain amplifier includes first and second DC offset cancellation circuits. Each of the DC offset cancellation circuits includes an operational amplifier provided with an inverse terminal, a non-inverse terminal and an output terminal; a first resistor connected to the non-inverse terminal: a second resistor connected between the inverse terminal and the output terminal; and a DC offset cancellation circuit connected between the inverse terminal and the non-inverse terminal, wherein the first and second DC offset cancellation circuits are connected with each other in series.

According to another embodiment of the invention, the first and second DC offset cancellation circuits each further includes a capacitor connected in parallel to the second resistor between the inverse terminal and the output terminal.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Figure 1:
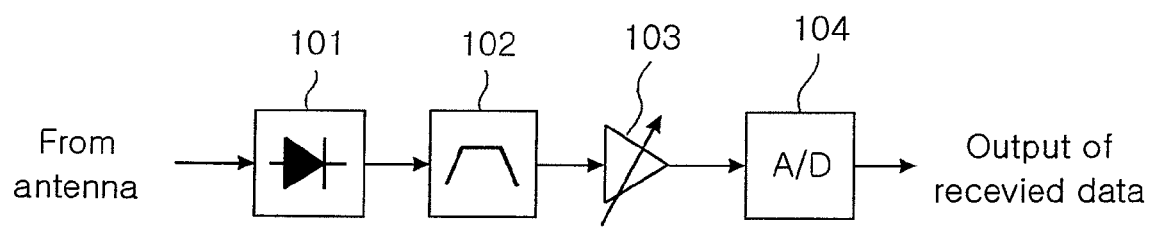
FIG. 1 is a block diagram partially illustrating a receiver of a chaotic RF transceiver according to the prior art.
Figure 2:
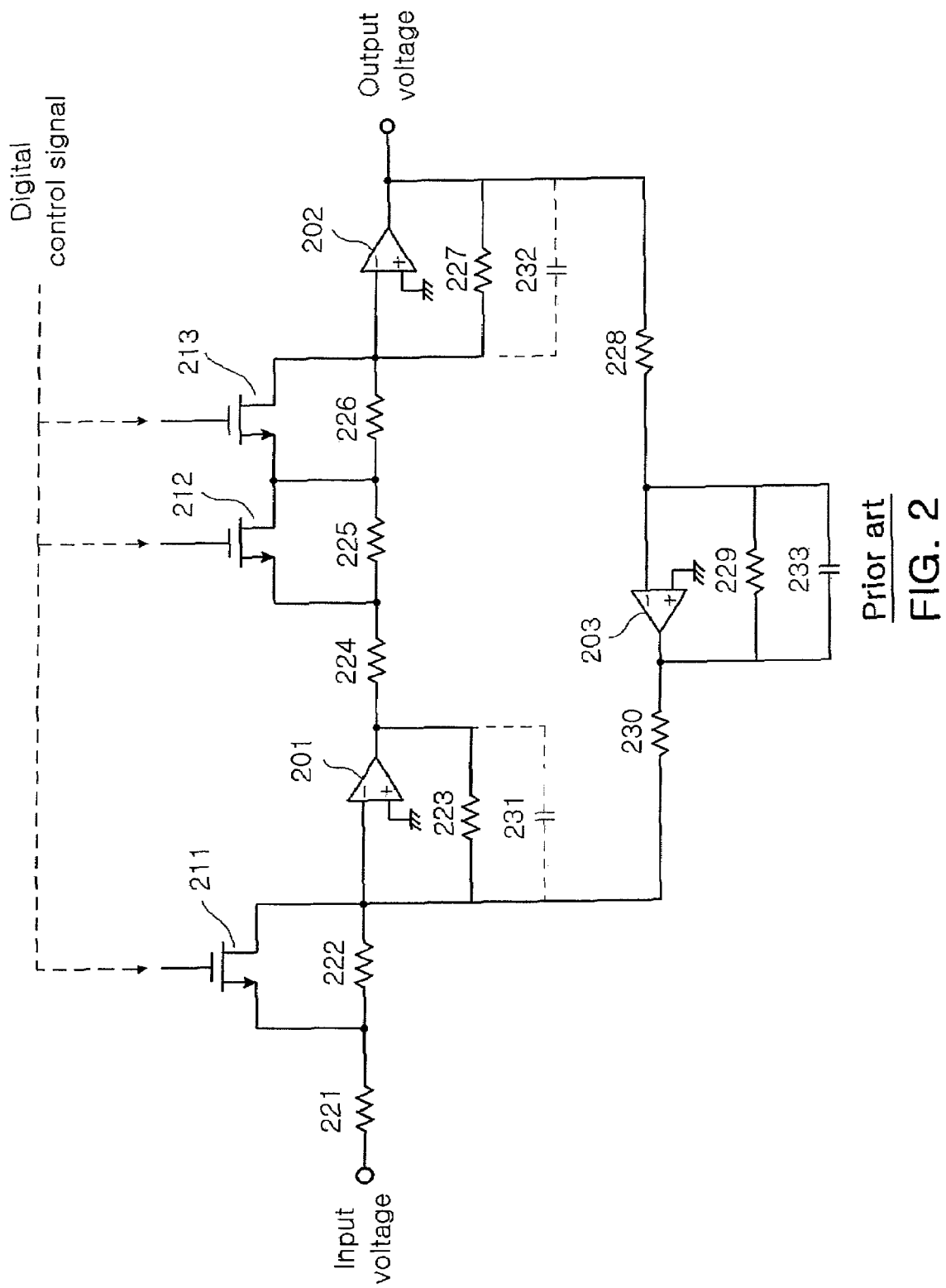
FIG. 2 is a circuit diagram illustrating a programmable gain amplifier according to the prior art.

Exemplary embodiments of the present invention will now be described in detail with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference signs are used to designate the same or similar components throughout.

Figure 3:
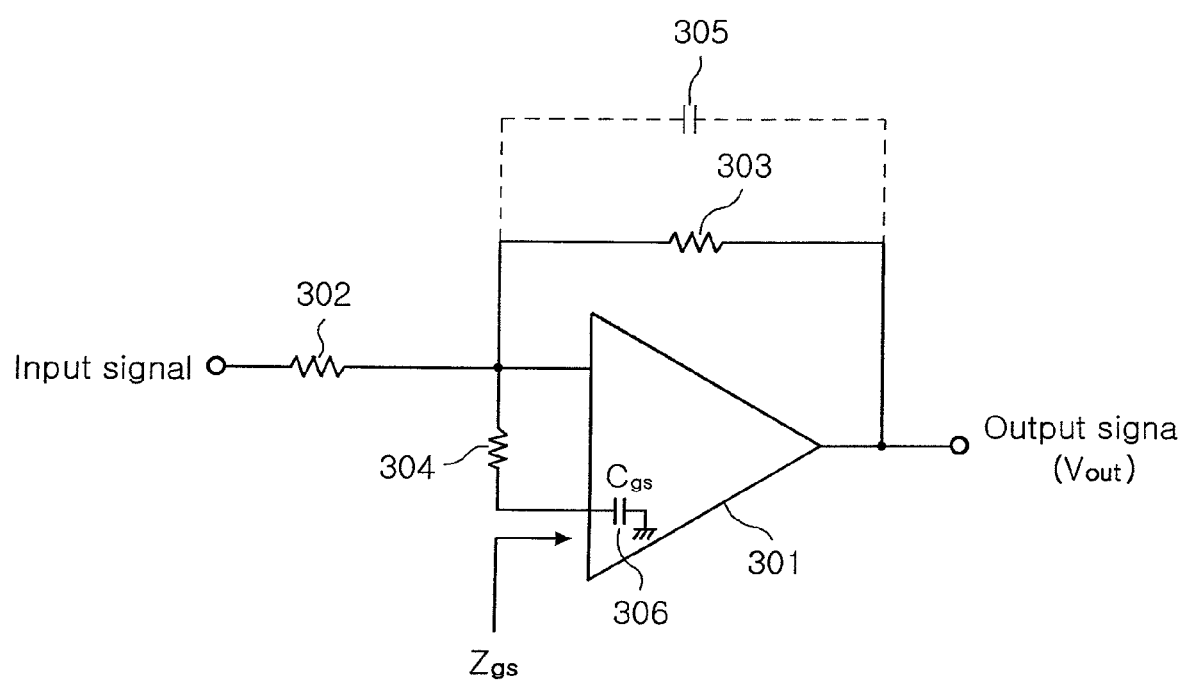
FIG. 3 is a circuit diagram illustrating a DC offset cancellation circuit according to the invention.

FIG. 3 is a circuit diagram illustrating a direct current (DC) offset cancellation circuit according to the invention.

As shown in FIG. 3, the DC offset cancellation circuit of the invention includes an operational amplifier 301, a first resistor 302, a second resistor 303 and a DC offset cancellation resistor 304. The operational amplifier 301 is provided with an inverse terminal, a non-inverse terminal and an output terminal. The first resistor 302 is connected to the non-inverse terminal. The second terminal 303 is connected between the inverse terminal and the output terminal. The DC offset cancellation resistor 304 is connected between the inverse terminal and the non-inverse terminal.

According to an embodiment of the invention, the DC offset cancellation circuit may further include a capacitor connected in parallel to the second resistor 303 between the inverse terminal and the output terminal.

Operation and effects of the DC offset cancellation circuit will be explained hereunder with reference to the DC offset cancellation circuit.

In an ideal operational amplifier, gain is infinite, input impedance is infinite and an output voltage is 0. However, in the actual operational amplifier, gain and impedance have a finite value, respectively. Especially, the operational amplifier is provided with an input terminal having a capacitor element $C_{gs}$ varied by a frequency. The capacitor element $C_{gs}$ present in the input terminal of the operational amplifier is designated with reference sign 306 in FIG. 3.

Here, internal input impedance $Z_{gs}$ of the operational amplifier 301 satisfies following Equation 1.

$$Z_{gs} = \frac{1}{2\pi f C_{gs}}$$ Equation 1

$$Z_{gs} = \frac{1}{2\pi f C_{gs}} \cong 0 (f \geq f_{DC})$$

$$Z_{gs} = \frac{1}{2\pi f C_{gs}} \cong \infty (f \leq f_{DC})$$

That is, internal input impedance $Z_{gs}$ of the non-inverse terminal is varied by frequency f. In the Equation 1, $f_{DC}$ denotes a reference frequency for canceling DC offset. In a case where an input signal has a frequency f lower than the reference frequency $f_{DC}$, DC offset is cancelled. Meanwhile, in a case where the input signal has a frequency higher than the reference signal $f_{DC}$, DC offset is not cancelled.

Figure 4:
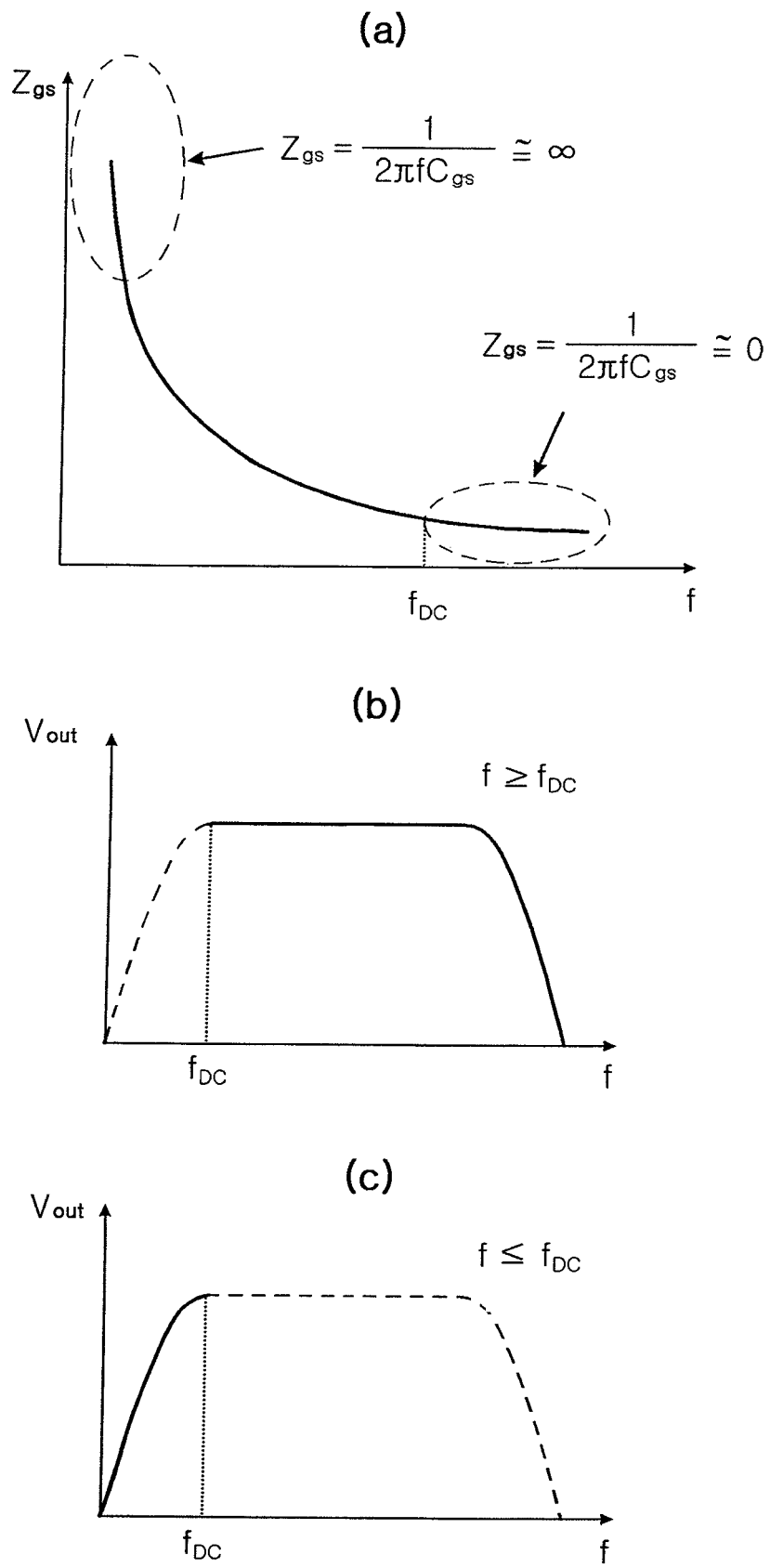
FIG. 4a illustrates frequency characteristics of internal input impedance at a non-inverse terminal of an operational amplifier of a DC offset cancellation circuit according to the invention.
FIGS. 4b and 4c illustrate frequency characteristics of an output voltage of a DC offset cancellation circuit according to the invention.

FIG. 4a is a graph illustrating internal input impedance of a non-inverse terminal with respect to a frequency of a DC offset circuit according to the invention.

As shown in FIG. 4a, in a case where the input signal has a frequency f higher than $f_{DC}$ ($f \geq f_{DC}$), the internal input impedance $Z_{gs}$ approximates 0, the non-inverse terminal is virtually grounded and the operational amplifier 301 operates ideally. On the other hand, in a case where the input signal has a frequency f lower than $f_{DC}$ ($f \leq f_{DC}$), the internal input impedance $Z_{gs}$ increases infinitely.

Specifically, in a case where the frequency is equal to or higher than $f_{DC}$, the operational amplifier operates ideally as just described. Also, the internal input impedance $Z_{gs}$ of the non-inverse terminal converges to zero. The inverse and non-inverse terminals are considered short-circuited with each other due to virtual short-circuit principle of the ideal operational amplifier. As a result, the inverse and non-inverse terminals are identical in voltage thereof and the non-inverse terminal has a voltage of 0.

Here, the input signal has a voltage of $V_{in}$, the inverse terminal of the operational amplifier has a voltage of $V_-$, the first resistor has a resistance of $R_1$, and the second resistor has a resistance of $R_2$. Accordingly, $V_-$ becomes 0, and current I flowing in the first resistor, an output voltage $V_{out}$ of an operational amplifier 301 and gain G can be derived according to following Equation 2.

$$I = \frac{V_{in} - V_-}{R_1} \cong \frac{V_{in}}{R1}$$ Equation 2

$$V_{out} = V_- - IR_2 \cong \frac{-R_2}{R_1} V_{in}$$

$$G = \frac{V_{out}}{V_{in}} = -\frac{R_2}{R_1}$$

FIG. 4b is a graph illustrating output of a DC offset cancellation circuit of the invention in a case where an operational amplifier has a frequency higher than $f_{DC}$.

In a case where the operational amplifier has a frequency lower than $f_{DC}$, the operational amplifier does not operate ideally. In this case, current I flowing in the first resistor, an output voltage $V_{out}$ of the operational amplifier 301 and gain G can be obtained according to following Equation 3.

$$I = \frac{V_{in} - V_-}{} \quad \text{Equation 3}$$

$$V_{out} = V_- - IR_2 =$$

$$V_- - \left(\frac{V_{in} - V_-}{R_1}\right)R_2 = \frac{R_2}{R_1}V_{in} + \left(1 + \frac{R_2}{R_1}\right)V_-$$

$$G = \frac{V_{out}}{V_{in}} = -\frac{R_2}{R_1}$$

FIG. 4c is a graph illustrating an output of a DC offset cancellation circuit according to the invention in a case where the operational amplifier has a frequency lower than $f_{DC}$.

In the Equation 3, gain is set to a value obtained by summing gain $$-\frac{R_2}{R_1}$$

of an ideal operational amplifier and gain $$\left(1 + \frac{R_2}{R_1}\right)\frac{V_-}{V_{in}}$$

of a non-ideal operational amplifier. That is, a frequency lower than $f_{DC}$ decreases gain by $$\left(1 + \frac{R_2}{R_1}\right)\frac{V_-}{V_{in}},$$

which is a DC offset component to be cancelled.

The circuit configured as just described in FIG. 3 can cancel DC component.

According to another embodiment of the invention, the DC offset cancellation circuit may further include a capacitor 305 connected in parallel to the second resistor 303 between the inverse terminal and the output terminal. An RC parallel circuit having the capacitor 305 and the second resistor 303 acts as a low pass filter (LPF) for feeding back an input signal of only low frequency bandwidth to the inverse terminal. That is, the RC parallel circuit selects only a frequency bandwidth for canceling DC offset of the operational amplifier to feed back, thereby achieving more precise effects of DC offset cancellation.

As described above, the DC cancellation resistor is connected between the inverse terminal and the non-inverse terminal to simply configure and easily design the DC offset cancellation circuit. This reduces the number of devices making up the DC offset cancellation circuit, thereby saving costs and consuming less power.

Figure 5:
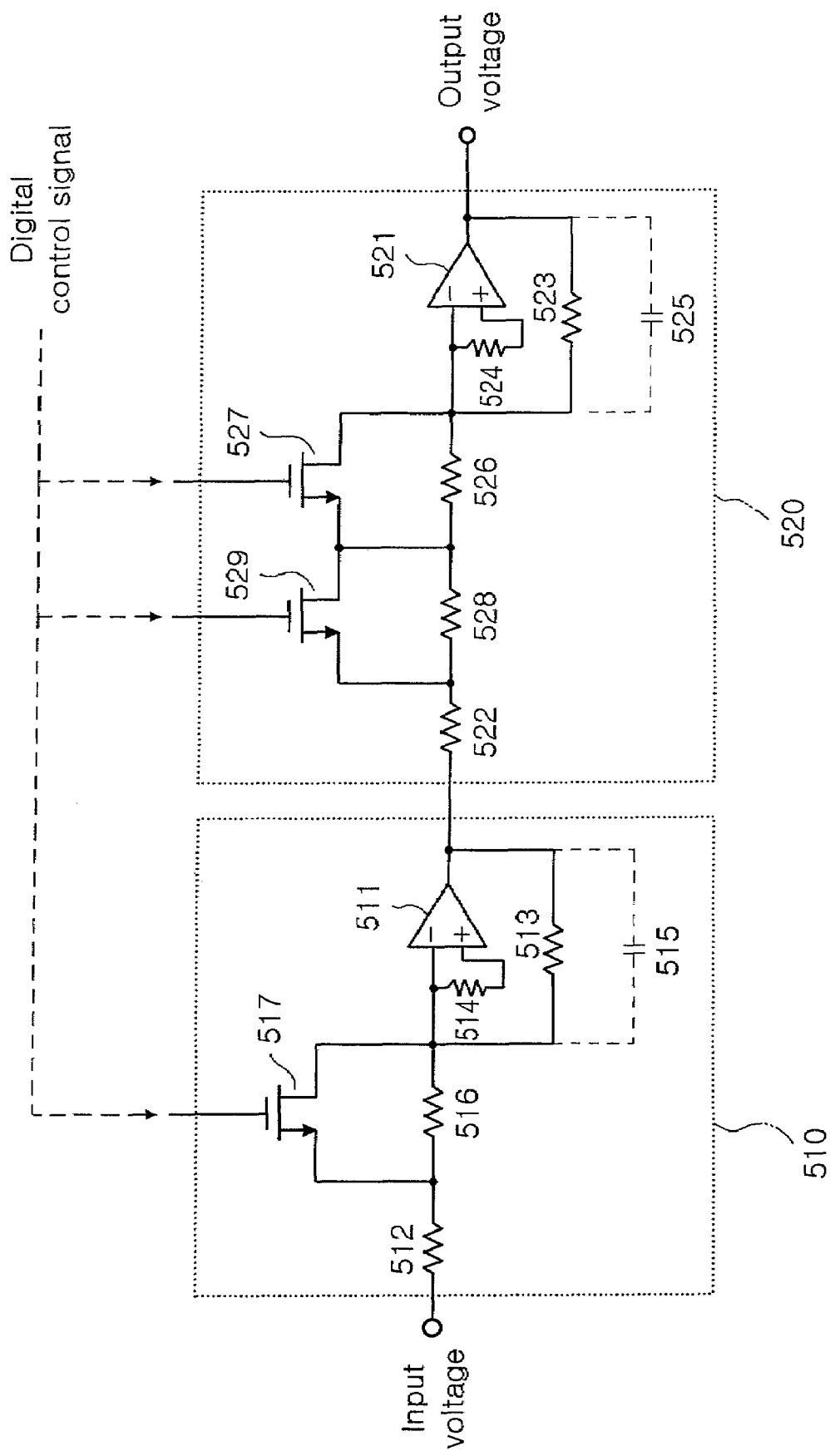
FIG. 5 is a circuit diagram illustrating a programmable gain amplifier according to the invention.

FIG. 5 is a circuit diagram illustrating a programmable gain amplifier according to the invention.

Referring to FIG. 5, the programmable gain amplifier (PGA) includes a first DC offset cancellation circuit 510 and a second DC offset cancellation circuit 520. The first DC offset cancellation circuit 510 includes an operational amplifier 511 provided with an inverse terminal, a non-inverse terminal and an output terminal, first resistors 512 and 516 connected to the non-inverse terminal, a second resistor 513 connected between the inverse terminal and the output terminal, and a DC offset cancellation resistor 514 connected between the inverse terminal and the non-inverse terminal. Likewise, the second DC offset cancellation circuit 520 includes an operational amplifier 521 provided with an inverse terminal, a non-inverse terminal and an output terminal, first resistors 522, 526 and 528 connected to the inverse terminal, a second resistor 523 connected between the inverse terminal and the output terminal and a DC offset cancellation resistor 524 connected between the inverse terminal and the non-inverse terminal. Here, the first and second DC offset cancellation circuits 510 and 520 are connected with each other in series.

Also, according to a preferred embodiment of the invention, the first DC offset cancellation circuit 510 may further include a capacitor 515 connected in parallel to the second resistor 513 between the inverse terminal and the output terminal. Likewise, the second DC offset cancellation circuit 520 may further include a capacitor 525 connected in parallel to the second resistor 523 between the inverse terminal and the output terminal.

Operation and effects of the programmable gain amplifier of the invention will be explained with reference to drawings.

As shown in FIG. 5, in the programmable gain amplifier of the invention, the two DC offset cancellation circuits 510 and 520 are connected with each other in series. The first DC offset cancellation circuit 510 cancels DC offset primarily and then the second offset cancellation circuit 520 cancels the DC offset secondarily to ensure more effective DC offset cancellation.

Referring to FIG. 5, the first resistors 512 and 516 of the first DC offset cancellation circuit 510 each have a resistance varied by a switch 517 that switches on/off in response to a digital control signal. Likewise, the first resistors 522, 526 and 528 of the second DC offset cancellation circuit 520 each have a resistance value varied by switches 527 and 529 that switch on/off in response to a digital control signal.

The programmable gain amplifier according to further another embodiment of the invention controls gain thereof using a 3-bit digital control signal. The control signal switches on/off the switches 517, 527 and 529 to vary a resistance of the first resistor of the first and second offset cancellation circuits 510 and 520. This accordingly leads to constant total gain of the PGA. The number of digital control signals of the PGA is illustrative only, but does not limit the invention. The number of the digital control signals may vary the number of switches and resistors connected thereto.

As described above, the PGA configured with the two operational amplifiers 511 and 521 is more cost-effective than the conventional one employing three operational amplifiers. This also ensures the PGA to be designed easily. Moreover, a fewer number of overall devices dissipate less power, thereby prolonging operation time of a mobile wireless telecommunication device running on battery power.

As set forth above, according to exemplary embodiments of the invention, a DC offset cancellation resistor is connected between an inverse terminal and a non-inverse terminal of an operational amplifier to simply configure a DC offset cancellation circuit. This also leads to simple configuration and easier design of a programmable gain amplifier (PGA). Moreover, a fewer number of operational amplifiers for the PGA diminishes the number of devices overall, thereby saving costs and consuming less power. In consequence, this extends operation time of a portable mobile telecommunication device adopting the PGA.

What is claimed is:

1. A DC offset cancellation circuit comprising:
   an operational amplifier provided with an inverse terminal, a non-inverse terminal and an output terminal;
   a first resistor connected to the inverse terminal;
   a second resistor connected between the inverse terminal and the output terminal; and
   a DC offset cancellation resistor having one end directly connected to the inverse terminal and the other end directly connected to the non-inverse terminal.

2. The DC offset cancellation circuit according to claim 1, further comprising a capacitor connected in parallel to the second resistor between the inverse terminal and the output terminal.

3. A programmable gain amplifier comprising first and second DC offset cancellation circuits, each of which includes:
   an operational amplifier provided with an inverse terminal, a non-inverse terminal and an output terminal;
   a first resistor connected to the inverse terminal;
   a second resistor connected between the inverse terminal and the output terminal; and
   a DC offset cancellation resistor having one end directly connected to the inverse terminal and the other end directly connected to the non-inverse terminal,
   wherein the first and second DC offset cancellation circuits are connected with each other in series.

4. The programmable gain amplifier according to claim 3, wherein the first and second DC offset cancellation circuits each further comprise a capacitor connected in parallel to the second resistor between the inverse terminal and the output terminal.

* * * * *